US008125467B2

(12) United States Patent
Wu et al.

(10) Patent No.: US 8,125,467 B2
(45) Date of Patent: Feb. 28, 2012

(54) TOUCH SENSOR WITH SLIDING STRUCTURE

(75) Inventors: Tzu-Yi Wu, Kaohsiung County (TW); Lee-Chun Guo, Tainan (TW)

(73) Assignee: ITE Tech. Inc., Hsinchu (TW)

( * ) Notice: Subject to any disclaimer, the term of this patent is extended or adjusted under 35 U.S.C. 154(b) by 407 days.

(21) Appl. No.: 12/505,544

(22) Filed: Jul. 20, 2009

(65) Prior Publication Data

US 2010/0295709 A1 Nov. 25, 2010

(30) Foreign Application Priority Data

May 21, 2009 (TW) .............................. 98116862 A (51) Int. Cl.
*G06F 3/045* (2006.01)

(52) U.S. Cl. ....................................... 345/174; 345/173
(58) Field of Classification Search .......... 345/173–179; 178/18.01–18.07, 19.01–19.03
See application file for complete search history.

(56) References Cited

U.S. PATENT DOCUMENTS

| 2003/0094354 A1* | 5/2003 | Badarneh ..................... 200/18 |
| 2010/0004027 A1* | 1/2010 | Jang et al. .................... 455/566 |
| 2010/0040400 A1* | 2/2010 | Hirsch ........................ 400/489 |
| 2010/0066810 A1* | 3/2010 | Ryu et al. ..................... 348/36 |
| 2011/0001722 A1* | 1/2011 | Newman et al. ............. 345/174 |
| 2011/0057899 A1* | 3/2011 | Sleeman et al. ............. 345/174 |

* cited by examiner

Primary Examiner — Ricardo L Osorio
(74) Attorney, Agent, or Firm — Jianq Chyun IP Office (57) ABSTRACT

A touch sensor with a sliding structure is disclosed. The touch sensor includes a first touch detecting plate, a second touch detecting plate, and a capacitance-to-digital converter. The first touch detecting plate includes a first tilt portion, and the second touch detecting plate includes a second tilt portion, wherein a bevel edge of the second tilt portion is parallel to a bevel edge of the first tilt portion. The first touch detecting plate and the second touch detecting plate form a parallelogram slide detecting area. The first touch detecting plate transmits a first detected capacitance, and the second touch detecting plate transmits a second detected capacitance. The capacitance-to-digital converter generates a sliding state detected value according to the first detected capacitance and the second detected capacitance.

13 Claims, 6 Drawing Sheets

100
TOUCH SENSOR WITH SLIDING STRUCTURE

CROSS-REFERENCE TO RELATED APPLICATION

This application claims the priority benefit of Taiwan application serial no. 98116862, filed on May 21, 2009. The entirety of the above-mentioned patent application is hereby incorporated by reference herein and made a part of specification.

BACKGROUND OF THE INVENTION

1. Field of the Invention

The present invention generally relates to a touch sensor of a touch panel, and more particularly, to a sliding structure touch sensor of a capacitive touch panel.

2. Description of Related Art

The consumers' demand to the quality and functionality of electronic products has been increasing along with the development of electronic technologies. Meanwhile, many personalized man-machine interfaces have been provided to attract more consumers.

The most common man-machine interface is touch panel. A touch panel is a device which directly receives input signals from a touch head (a finger or a stylus). When a user touches the touch panel with his finger, a touch sensor on the touch panel correspondingly generates an electric signal and determines the action performed by the user on the touch panel according to the electric signal. Touch panels can be generally categorized into capacitive touch panels and resistive touch panels.

Figure 1:
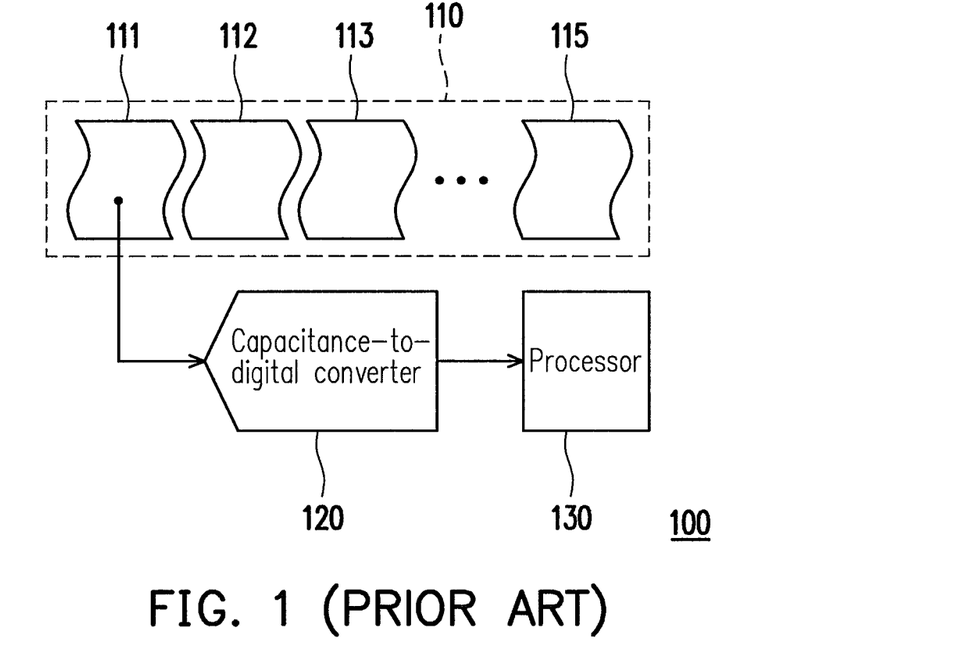
FIG. 1 is a diagram of a conventional sliding structure touch sensor 100.

Additionally, a touch panel with a sliding structure is developed based on the technique of the capacitive touch panel. FIG. 1 is a diagram of a conventional sliding structure touch sensor 100. Referring to FIG. 1, the touch sensor 100 includes touch detecting plates 111~115, a capacitance-to-digital converter 120, and a processor 130. The touch detecting plates 111~115 are connected with each other in series to form a slide detecting area 110. A conductive line is disposed on the touch detecting plate 111 for transmitting a detected capacitance generated within the slide detecting area 110 to the capacitance-to-digital converter 120. The capacitance-to-digital converter 120 converts the analog detected capacitance into a digital signal and transmits the digital detected capacitance to the processor 130. The processor 130 then calculates a state of the touch action performed by a user by using one or more digital detected capacitances.

The processor 130 should be able to carry out a great quantity of calculations when the user performs a complicated touch action (for example, slides his finger back and forth) on foregoing conventional touch sensor 100. Thus, the cost of the entire touch sensor 100 is greatly increased, and accordingly, the cost of an electronic device adopting this touch sensor is also increased.

SUMMARY OF THE INVENTION

Accordingly, the present invention is directed to a sliding structure touch sensor which can determine the relative position of a touched point on a touch panel.

The present invention provides a touch sensor with a sliding structure. The touch sensor includes a first touch detecting plate, a second touch detecting plate, and a capacitance-to-digital converter. The first touch detecting plate includes a first tilt portion, and the second touch detecting plate includes a second tilt portion, wherein a bevel edge of the second tilt portion is parallel to a bevel edge of the first tilt portion, and the first touch detecting plate and the second touch detecting plate form a parallelogram slide detecting area. The capacitance-to-digital converter is directly connected to the first touch detecting plate at one side of the slide detecting area through a first conductive line for transmitting a first detected capacitance, and the capacitance-to-digital converter is directly connected to the second touch detecting plate at another side of the slide detecting area through a second conductive line for transmitting a second detected capacitance. It should be noted that the capacitance-to-digital converter generates a sliding state detected value according to the first detected capacitance and the second detected capacitance.

According to an embodiment of the present invention, the touch sensor further includes a third touch detecting plate. The third touch detecting plate is in a parallelogram shape and is disposed between the first touch detecting plate and the second touch detecting plate, wherein a first bevel edge of the third touch detecting plate is parallel to the bevel edge of the first tilt portion of the first touch detecting plate, a second bevel edge of the third touch detecting plate is parallel to the bevel edge of the second tilt portion of the second touch detecting plate, and the first bevel edge of the third touch detecting plate is parallel to the second bevel edge of the third touch detecting plate.

According to an embodiment of the present invention, the first touch detecting plate further includes a first flat panel portion connected to a flat edge of the first tilt portion.

According to an embodiment of the present invention, the second touch detecting plate further includes a second flat panel portion connected to a flat edge of the second tilt portion.

According to an embodiment of the present invention, the capacitance-to-digital converter calculates a difference between the first detected capacitance and the second detected capacitance to obtain the sliding state detected value.

According to an embodiment of the present invention, the sliding state detected value is a digital signal.

According to an embodiment of the present invention, the touch sensor further includes a controller, wherein the controller is coupled to the capacitance-to-digital converter for receiving the sliding state detected value and determining a touched state of the touch sensor according to the sliding state detected value.

The present invention further provides a touch sensor with a sliding structure. The touch sensor includes a first touch detecting plate, a second touch detecting plate, and a capacitance-to-digital converter. The first touch detecting plate includes a first tilt portion, and the second touch detecting plate includes a second tilt portion, wherein a bevel edge of the second tilt portion is parallel to a bevel edge of the first tilt portion, and the first touch detecting plate and the second touch detecting plate form a parallelogram slide detecting area. The capacitance-to-digital converter has a first input terminal and a second input terminal. The first touch detecting plate at one side of the slide detecting area is coupled to the first input terminal for transmitting a first detected capacitance. The second touch detecting plate at another side of the slide detecting area is coupled to the first input terminal or the second input terminal for transmitting a second detected capacitance. The capacitance-to-digital converter generates a sliding state detected value according to the first detected capacitance and the second detected capacitance.

According to an embodiment of the present invention, the first input terminal is a positive input terminal of the capacitance-to-digital converter, and the second input terminal is a negative input terminal of the capacitance-to-digital converter.

According to an embodiment of the present invention, when the second touch detecting plate at the other side of the slide detecting area is coupled to the first input terminal, the capacitance-to-digital converter calculates a sum of the first detected capacitance and the second detected capacitance to obtain the sliding state detected value. When the second touch detecting plate at the other side of the slide detecting area is coupled to the second input terminal, the capacitance-to-digital converter calculates a difference between the first detected capacitance and the second detected capacitance to obtain the sliding state detected value.

As described above, in the present invention, two complementary touch detecting plates are adopted to form a parallelogram slide detecting area. In addition, two detected capacitances are respectively received from the two touch detecting plates, and a sliding state detected value is calculated based on these two detected capacitances, wherein the sliding state detected value is calculated by performing a simple arithmetical calculation on the two detected capacitances, and the state of a touch action performed by a user can be determined according to the sliding state detected value.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
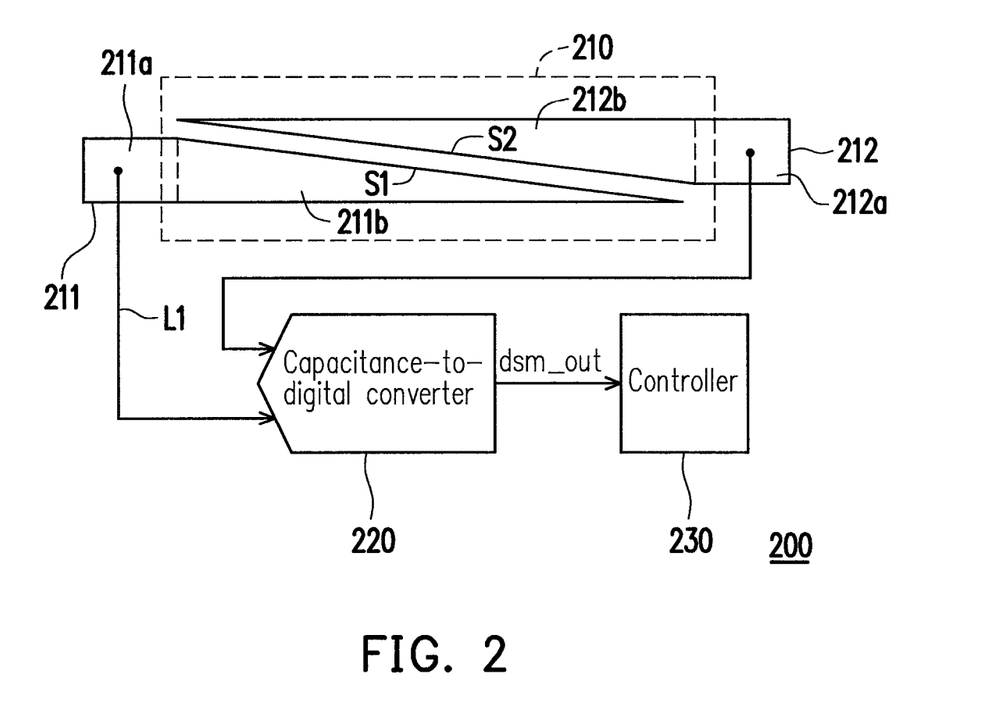
FIG. 2 is a diagram of a sliding structure touch sensor 200 according to an embodiment of the present invention.

FIG. 2 is a diagram of a sliding structure touch sensor 200 according to an embodiment of the present invention. Referring to FIG. 2, the touch sensor 200 includes a first touch detecting plate 211, a second touch detecting plate 212, a capacitance-to-digital converter 220, and a controller 230. The first touch detecting plate 211 includes a flat panel portion 211a and a tilt portion 211b. Similarly, the second touch detecting plate 212 includes a flat panel portion 212a and a tilt portion 212b.

In addition, a bevel edge s2 of the second tilt portion 212b of the second touch detecting plate 212 is parallel to a bevel edge s1 of the first tilt portion 211b of the first touch detecting plate 211, and the first touch detecting plate 211 and the second touch detecting plate 212 form a parallelogram slide detecting area 210. In the present embodiment, the slide detecting area 210 is in a rectangular shape.

A first conductive line L1 is disposed at one end (the right end, as shown in FIG. 2) of the first touch detecting plate 211 to directly connect the first touch detecting plate 211 to the capacitance-to-digital converter 220. Contrarily, a second conductive line L2 is disposed on another end (the left end, as shown in FIG. 2) of the second touch detecting plate 212 to directly connect the second touch detecting plate 212 to the capacitance-to-digital converter 220. The capacitance-to-digital converter 220 receives the detected capacitances respectively from the first touch detecting plate 211 and the second touch detecting plate 212 through the first conductive line L1 and the second conductive line L2, and the capacitance-to-digital converter 220 calculates a sliding state detected value dsm_out according to the received detected capacitances.

The controller 230 is coupled to the capacitance-to-digital converter 220 and receives the sliding state detected value dsm_out. The sliding state detected value dsm_out is a digital signal. Accordingly, after the controller 230 receives the sliding state detected value dsm_out, it can perform a simple calculation to determine a touch action performed by a user within the slide detecting area 210.

It should be noted that in the present embodiment, the first touch detecting plate 211 and the second touch detecting plate 212 have the same shape, and the first touch detecting plate 211 and the second touch detecting plate 212 are complementarily arranged to form the parallelogram slide detecting area 210. Thus, when the user touches the left end of the slide detecting area 210 (as shown in FIG. 2) with his finger, the finger contacts more of the first touch detecting plate 211 but less of the second touch detecting plate 212. Accordingly, the detected capacitance transmitted by the first touch detecting plate 211 is greater than that transmitted by the second touch detecting plate 212. If the user moves his finger from the left end of the slide detecting area 210 rightwards, the detected capacitance transmitted by the first touch detecting plate 211 gradually decreases, while the detected capacitance transmitted by the second touch detecting plate 212 gradually increases. When the user's finger reaches the rightmost end of the slide detecting area 210, the detected capacitance transmitted by the second touch detecting plate 212 reaches its maximum value, while the detected capacitance transmitted by the first touch detecting plate 211 reaches its minimum value.

Figure 3A:
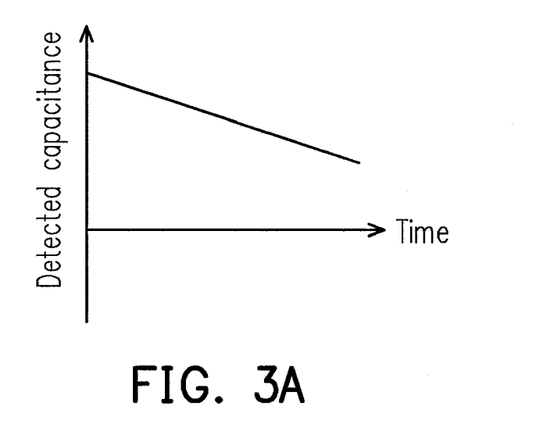
FIGS. 3A~3C respectively illustrate the variations of detected capacitances.
Figure 3B:
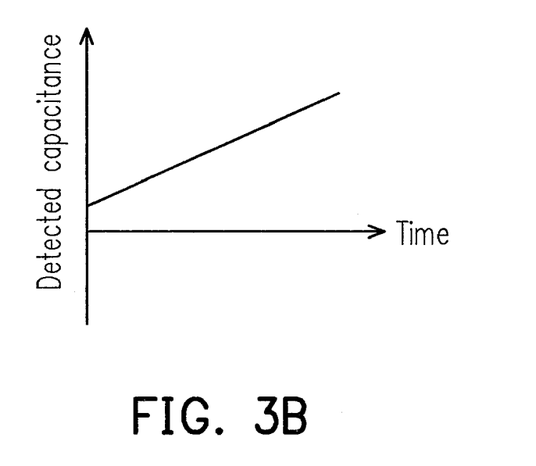
Figure 3C:
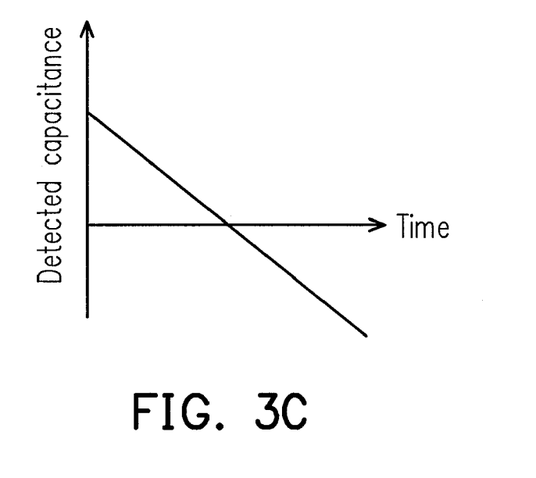

FIGS. 3A~3C respectively illustrate the variations of the detected capacitances, wherein FIG. 3A illustrates the variation of the detected capacitance transmitted by the first touch detecting plate 211 when the user moves his finger from the leftmost end of the slide detecting area 210 to the rightmost end of the slide detecting area 210. When the user's finger touches the leftmost end of the slide detecting area 210, it has the largest touch area with the first touch detecting plate 211, and accordingly, the maximum detected capacitance is generated. When the user moves his finger to the rightmost end of the slide detecting area 210 at a constant speed, the detected capacitance is reduced to its minimum value (almost 0).

FIG. 3B illustrates the variation of the detected capacitance transmitted by the second touch detecting plate 212 when the user moves his finger from the leftmost end of the slide detecting area 210 to the rightmost end of the slide detecting area 210. Because the second touch detecting plate 212 is arranged complementarily to the first touch detecting plate 211 (upside down and left side right), the user's finger has the smallest contact area with the second touch detecting plate 212 when it has the largest contact area with the first touch detecting plate 211. Contrarily, the user's finger has the largest contact area with the second touch detecting plate 212 when it has the smallest contact area with the first touch detecting plate 211. Accordingly, the waveform of the detected capacitance variation illustrated in FIG. 3B is an ascending straight line.

FIG. 3C illustrates the result obtained by subtracting the waveform in FIG. 3A from the waveform illustrated in FIG. 3C. Namely, FIG. 3C illustrates the difference between the detected capacitance transmitted by the first touch detecting plate 211 and the detected capacitance transmitted by the second touch detecting plate 212. Herein the difference between the detected capacitances transmitted by the first touch detecting plate 211 and the second touch detecting plate 212 is a descending straight line. When a detected capacitance corresponding to the descending straight line is positive, the user's finger touches the left half of the slide detecting area 210. When a detected capacitance corresponding to the descending straight line is negative, the user's finger touches the right half of the slide detecting area 210. When a detected capacitance corresponding to the descending straight line is 0, the user's finger touches the middle of the slide detecting area 210.

It should be noted herein that the difference between the detected capacitances transmitted by the first touch detecting plate 211 and the second touch detecting plate 212 is calculated by the capacitance-to-digital converter 220.

Referring to FIG. 2 again, the first touch detecting plate 211 and the second touch detecting plate 212 respectively include a flat panel area 211a and a flat panel area 212a, wherein the flat panel area 211a and the flat panel area 212a are disposed for providing a buffering function when the user's finger reaches an edge of the slide detecting area 210, so that detection error caused when the user's finger exceeds the edge can be effectively avoided. The width of the flat panel areas 211a and 212a may be about one to one and a half the width of a human finger.

Figure 4:
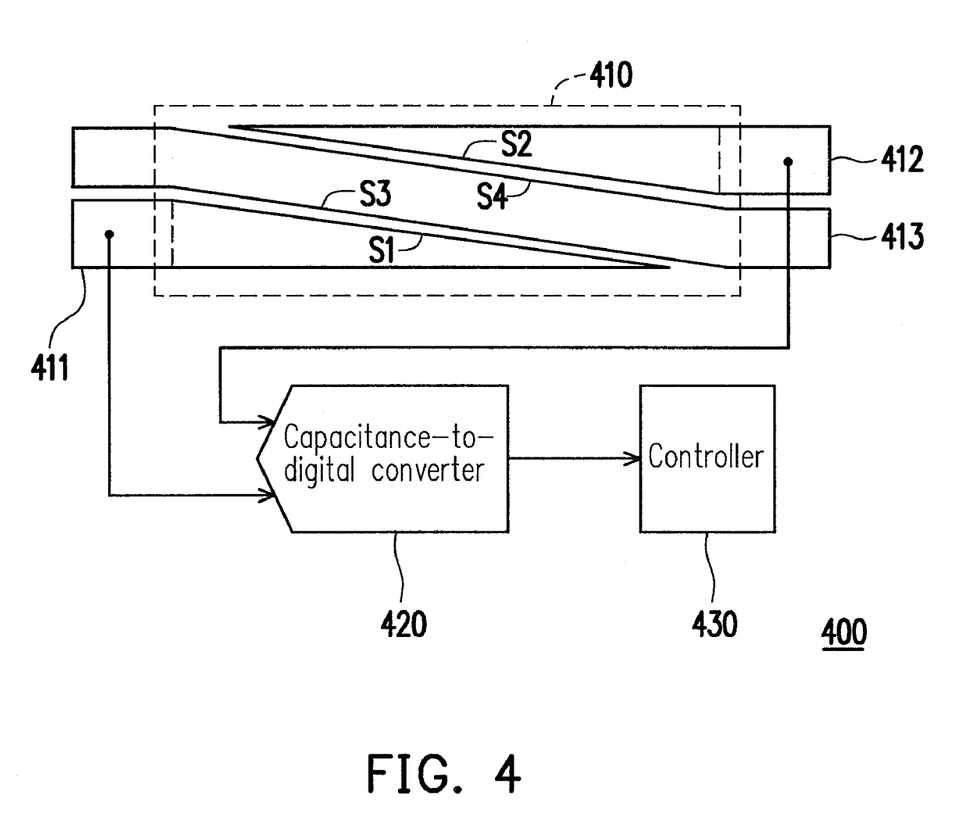
FIG. 4 is a diagram of a sliding structure touch sensor 400 according to another embodiment of the present invention.

FIG. 4 is a diagram of a sliding structure touch sensor 400 according to another embodiment of the present invention. Referring to FIG. 4, besides a first touch detecting plate 411 and a second touch detecting plate 412, the touch sensor 400 in the present embodiment further includes a third touch detecting plate 413, wherein the third touch detecting plate 413 is in a parallelogram shape and is disposed between the first touch detecting plate 411 and the second touch detecting plate 412. A first bevel edge s3 of the third touch detecting plate 413 is parallel to the bevel edge s1 of the first touch detecting plate 411, and a second bevel edge s4 of the third touch detecting plate 413 is parallel to the bevel edge s2 of the second touch detecting plate 412. In addition, the first bevel edge s3 of the third touch detecting plate 413 and the second bevel edge s4 of the third touch detecting plate 413 are parallel to each other.

Figure 5A:
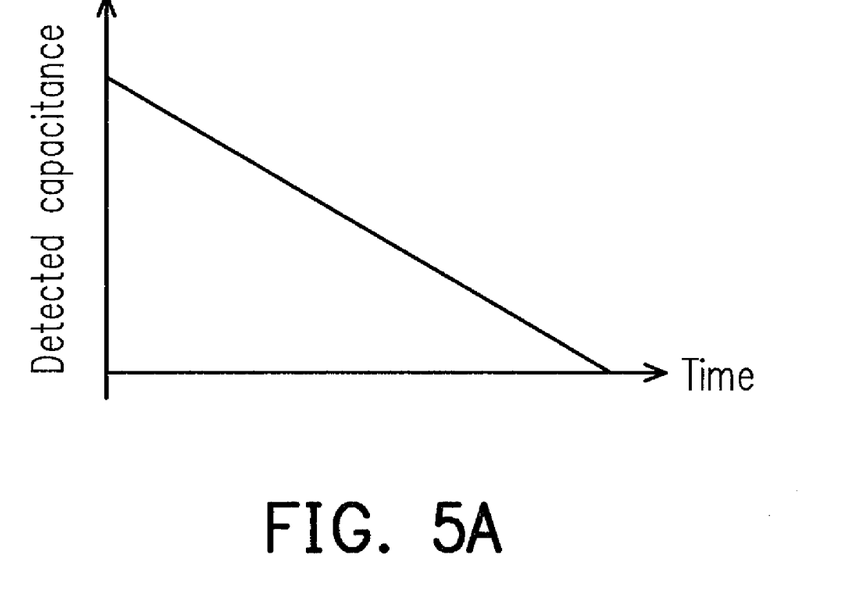
FIG. 5A and FIG. 5B respectively illustrate the variation of a detected capacitance transmitted by a third touch detecting plate 413 in different touch state.
Figure 5B:
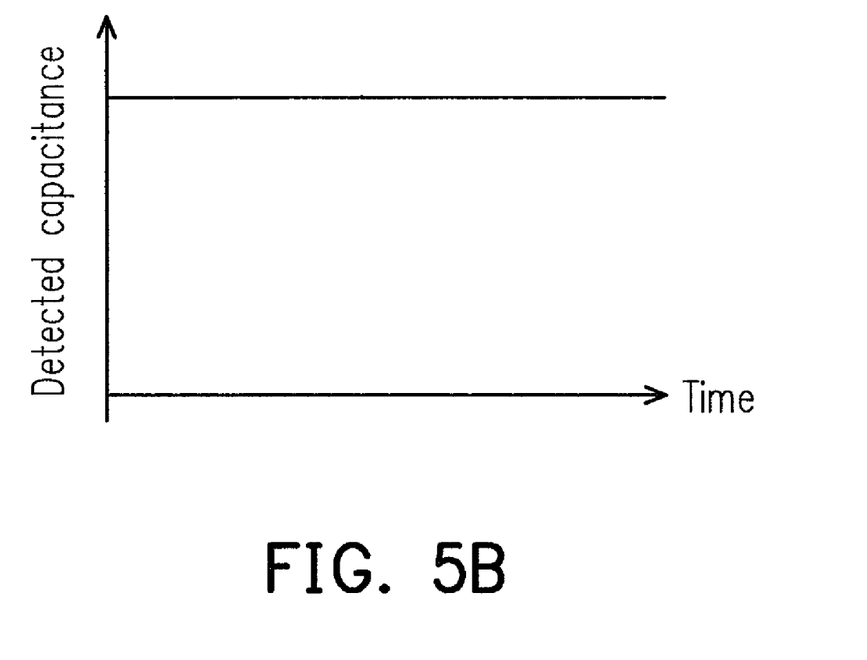

FIG. 5A and FIG. 5B respectively illustrate the variation of a detected capacitance transmitted by the third touch detecting plate 413 in different touch state. First, referring to FIG. 5A, if the user touches a point on the third touch detecting plate 413 with his finger for some time and then moves his finger away, the detected capacitance transmitted by the third touch detecting plate 413 is only generated when the finger touches the point. After the user moves his finger away, the detected capacitance gradually decreases until it reaches almost 0.

In addition, referring to FIG. 5B, if the user's finger stays within the slide detecting area 410, since the third touch detecting plate 413 is in a parallelogram shape, the finger always has the same contact area with the third touch detecting plate 413 regardless of where the finger touches within the slide detecting area 410. Namely, the detected capacitance transmitted by the third touch detecting plate 413 has a constant value.

As described above, with the disposition of the third touch detecting plate 413, whether the user touches the slide detecting area 410 and then moves his finger away or whether the user's finger stays within the slide detecting area 410 can be determined by the touch sensor 400 according to the difference between the detected capacitance variations respectively illustrated in FIG. 5A and FIG. 5B. Accordingly, the detection dimensions of the touch sensor 400 are effectively increased.

Figure 6A:
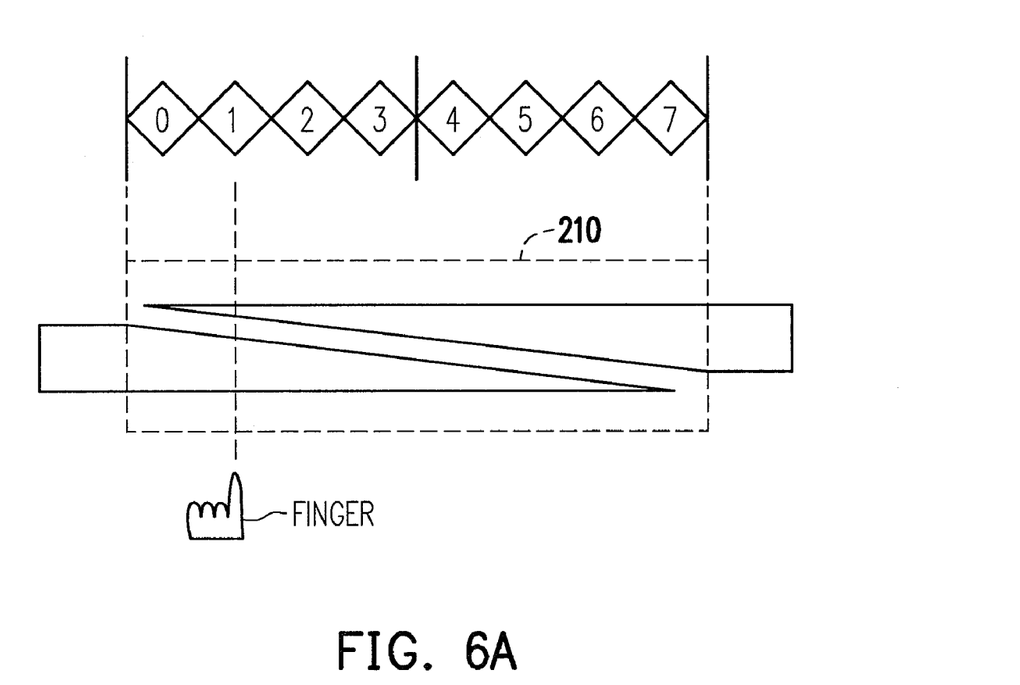
FIG. 6A is a diagram illustrating how a user touches a slide detecting area 210.
Figure 6B:
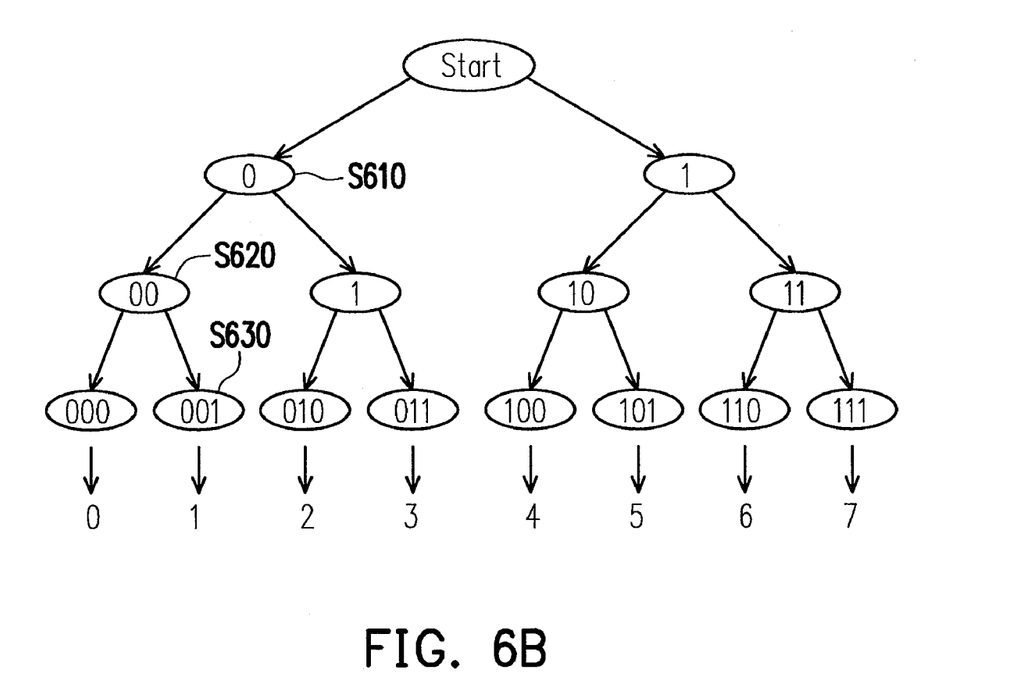
FIG. 6B is a flowchart of a binary search adopted by a controller 230.

Next, how a controller in a touch sensor provided by the present invention calculates a touch state will be described below with reference to an embodiment of the present invention. FIG. 6A is a diagram illustrating how a user touches the slide detecting area 210, and FIG. 6B is a flowchart of a binary search adopted by the controller 230.

Referring to FIG. 6A, when the user touches the slide detecting area 210 with his finger, the capacitance-to-digital converter 220 correspondingly generates a sliding state detected value dsm_out. In the present embodiment, the capacitance-to-digital converter 220 sends the sliding state detected value dsm_out to the controller 230, and the controller 230 correspondingly generates a position related level "001", wherein the position related level is used for determining a touch position when the touch sensor is applied, and the corresponding relationship is illustrated in FIG. 6A.

After obtaining the position related level "001", the controller 230 determines the touch position of the user's finger. First, the controller 230 determines that the first bit in the position related level is "0" (step S610), and then, determines the second bit in the position related level is "0" (step S620). Finally, the controller 230 determines the last bit in the position related level is "1" (step S630) and accordingly the user touches the portion "1" in the slide detecting area 210 with his finger.

It should be mentioned that the binary search described above is only an example for explaining that the controller 230 can obtain the position related level according to the sliding state detected value dsm_out and determine the touch state through a simple method. However, the present invention is not limited thereto, and those having ordinary knowledge in the art should be able to adopt any other search method (for example, a table look-up method) as long as the position related level can be obtained according to the digital sliding state detected value dsm_out.

Figure 7:
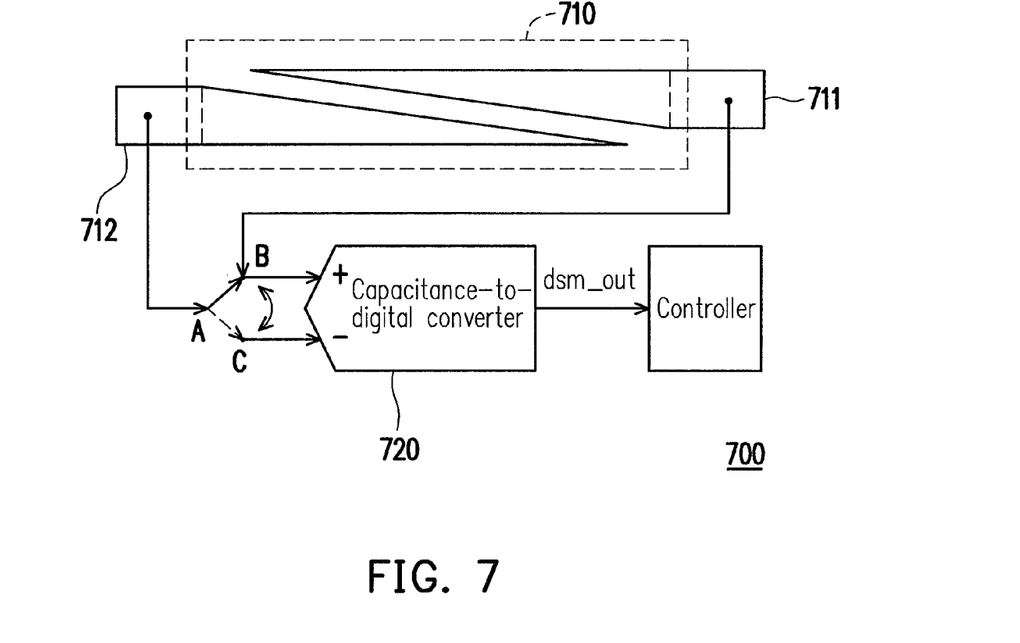
FIG. 7 is a diagram of a sliding structure touch sensor 700 according to yet another embodiment of the present invention.

FIG. 7 is a diagram of a sliding structure touch sensor 700 according to yet another embodiment of the present invention. Referring to FIG. 7, in the present embodiment, the first touch detecting plate 711 of the touch sensor 700 at one side (right side, as shown in FIG. 7) of the slide detecting area 710 is coupled to an input terminal (a positive input terminal) of the capacitance-to-digital converter 720, and the second touch detecting plate 712 at the other side (left side, as shown in FIG. 7) of the slide detecting area 710 is coupled to another input terminal (a negative input terminal) of the capacitance-to-digital converter 720, so as to establish a differential connection (from the terminal A to the terminal C, as shown in FIG. 7) or a parallel connection (from the terminal A to the terminal B, as shown in FIG. 7).

When foregoing parallel connection is established, both the detected capacitances transmitted by the two touch detecting plates 711 and 712 are transmitted to the positive input terminal of the capacitance-to-digital converter 720. It is like disposing a touch detecting plate of an equal width in the slide detecting area 710, and the sum of the two detected capacitances transmitted by the touch detecting plates 711 and 712 is calculated as the sliding state detected value. Same as in the touch sensor 400 illustrated in FIG. 4 (wherein a parallelogram third touch detecting plate 413 is disposed), whether the user's finger stays in the slide detecting area 710 or has been moved away can be determined in the touch sensor 700.

In addition, when foregoing differential connection is established, same as in the touch sensor 200 illustrated in FIG. 2, the touch position of the user's finger within the slide detecting area 710 can be determined in the touch sensor 700. In this case, the difference between the two detected capacitances transmitted by the two touch detecting plates 711 and 712 is calculated as the sliding state detected value. Accordingly, the touch position of the user's finger and whether the user's finger stays within the slide detecting area or has been moved away can be both determined by repeatedly changing the connection between the differential connection and the parallel connection.

Figure 8:
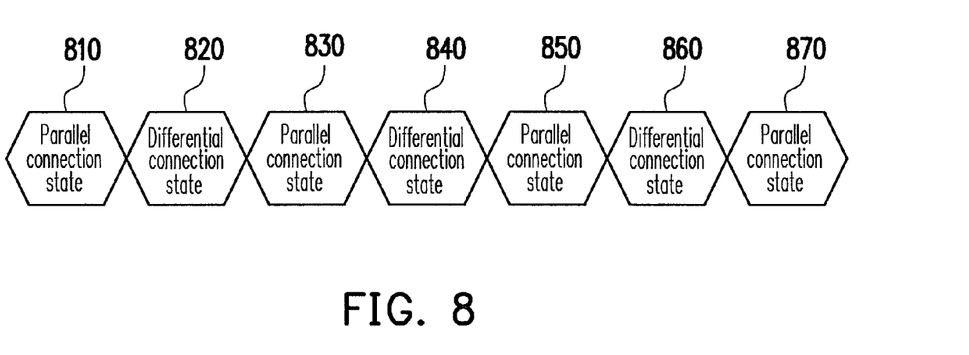
FIG. 8 is a flowchart illustrating a detection operation of the touch sensor 700 in FIG. 7.

FIG. 8 is a flowchart illustrating a detection operation of the touch sensor 700 in FIG. 7. Referring to FIG. 8, at the beginning, the touch sensor 700 is set to a parallel connection state 810 to detect whether the user touches the touch sensor 700. Once the touch sensor 700 detects the user's finger, the touch sensor 700 is changed to a differential connection state 820. In order to detect the finger leaving the touch sensor 700 instantly, the touch sensor 700 is sequentially set to a parallel connection state 830, a differential connection state 840, and a parallel connection state 850 . . . . Assuming the user moves his finger away from the touch sensor 700 when the touch sensor 700 is in the differential connection state 860, the touch sensor 700 detects the action when it is in the parallel connection state 870, and it is stopped to switch the touch sensor 700 between the parallel connection state and the differential connection state.

As described above, in the present invention, two complementary touch detecting plates are adopted to form a slide detecting area, so as to effectively determine the state of a touch action performed by a user. Moreover, in the present invention, another parallelogram touch detecting plate is further adopted to detect whether the user's finger leaves the slide detecting area, so as to increase the detection dimensions of the touch sensor.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A touch sensor with a sliding structure, comprising:
a first touch detecting plate, comprising a first tilt portion;
a second touch detecting plate, comprising a second tilt portion, wherein a bevel edge of the second tilt portion is parallel to a bevel edge of the first tilt portion, and the first touch detecting plate and the second touch detecting plate form a parallelogram slide detecting area; and a capacitance-to-digital converter, directly connected to the first touch detecting plate at one side of the slide detecting area through a first conductive line for transmitting a first detected capacitance, and directly connected to the second touch detecting plate at another side of the slide detecting area through a second conductive line for transmitting a second detected capacitance;
wherein the capacitance-to-digital converter generates a sliding state detected value according to the first detected capacitance and the second detected capacitance.

2. The touch sensor according to claim 1 further comprising:
a third touch detecting plate, having a parallelogram shape, disposed between the first touch detecting plate and the second touch detecting plate, wherein a first bevel edge of the third touch detecting plate is parallel to the bevel edge of the first tilt portion of the first touch detecting plate, a second bevel edge of the third touch detecting plate is parallel to the bevel edge of the second tilt portion of the second touch detecting plate, and the first bevel edge of the third touch detecting plate and the second bevel edge of the third touch detecting plate are parallel to each other.

3. The touch sensor according to claim 1, wherein the first touch detecting plate further comprises a first flat panel portion connected to a flat edge of the first tilt portion.

4. The touch sensor according to claim 1, wherein the second touch detecting plate further comprises a second flat panel portion connected to a flat edge of the second tilt portion.

5. The touch sensor according to claim 1, wherein the capacitance-to-digital converter calculates a difference between the first detected capacitance and the second detected capacitance to obtain the sliding state detected value.

6. The touch sensor according to claim 1, wherein the sliding state detected value is a digital signal.

7. The touch sensor according to claim 1 further comprising:
a controller, coupled to the capacitance-to-digital converter, for receiving the sliding state detected value and determining a touched state of the touch sensor according to the sliding state detected value.

8. A touch sensor with a sliding structure, comprising:
a first touch detecting plate, comprising a first tilt portion;
a second touch detecting plate, comprising a second tilt portion, wherein a bevel edge of the second tilt portion is parallel to a bevel edge of the first tilt portion, and the first touch detecting plate and the second touch detecting plate form a parallelogram slide detecting area; and
a capacitance-to-digital converter, having a first input terminal and a second input terminal, wherein the first touch detecting plate at one side of the slide detecting area is coupled to the first input terminal for transmitting a first detected capacitance, and the second touch detecting plate at another side of the slide detecting area is coupled to the first input terminal or the second input terminal for transmitting a second detected capacitance;
wherein the capacitance-to-digital converter generates a sliding state detected value according to the first detected capacitance and the second detected capacitance.

9. The touch sensor according to claim 8, wherein the first touch detecting plate further comprises a first flat panel portion connected to a flat edge of the first tilt portion.

10. The touch sensor according to claim 8, wherein the second touch detecting plate further comprises a second flat panel portion connected to a flat edge of the second tilt portion.

11. The touch sensor according to claim 8, wherein the first input terminal is a positive input terminal of the capacitance-to-digital converter, and the second input terminal is a negative input terminal of the capacitance-to-digital converter.

12. The touch sensor according to claim 11, wherein when the second touch detecting plate at the other side of the slide detecting area is coupled to the first input terminal, the capacitance-to-digital converter calculates a sum of the first detected capacitance and the second detected capacitance to obtain the sliding state detected value, and when the second touch detecting plate at the other end of the slide detecting area is coupled to the second input terminal, the capacitance-to-digital converter calculates a difference between the first detected capacitance and the second detected capacitance to obtain the sliding state detected value.

13. The touch sensor according to claim 8 further comprising:
 a controller, coupled to the capacitance-to-digital converter, for receiving the sliding state detected value and determining a touched state of the touch sensor according to the sliding state detected value.

* * * * *